(12) United States Patent
Wong et al.

(10) Patent No.: US 6,417,098 B1
(45) Date of Patent: Jul. 9, 2002

(54) ENHANCED SURFACE MODIFICATION OF LOW K CARBON-DOPED OXIDE

(75) Inventors: Lawrence D. Wong, Beaverton; Donald Danielson, Forest Grove; Sarah Bowen, Beaverton; Ebrahim Andideh, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/458,547

(22) Filed: Dec. 9, 1999

(51) Int. Cl.$^7$ .................. H01L 21/28; H01L 21/469; H01L 21/31
(52) U.S. Cl. .................. 438/638; 438/783; 438/787
(58) Field of Search .................. 438/689, 745, 438/783, 787, 705, 638

(56) References Cited

U.S. PATENT DOCUMENTS

| | | | |
|---|---|---|---|
| 4,885,106 A | * 12/1989 | Lapham | 252/100 |
| 5,631,189 A | * 5/1997 | Kobayashi | 438/448 |
| 5,693,550 A | * 12/1997 | Torii | 437/41 |
| 5,953,620 A | * 9/1999 | Katou | 438/406 |
| 5,989,997 A | * 11/1999 | Lin | 438/622 |
| 6,171,881 B1 | * 1/2000 | Fujii | 438/52 |
| 6,025,273 A | * 2/2000 | Chen | 438/706 |
| 6,043,155 A | * 3/2000 | Homma | 438/691 |
| 6,060,344 A | * 5/2000 | Matsui | 438/164 |
| 6,114,259 A | * 9/2000 | Sukharev | 438/789 |

\* cited by examiner

*Primary Examiner*—Mary Wilczewski
(74) *Attorney, Agent, or Firm*—Blakely, Sokoloff, Taylor & Zafman LLP

(57) ABSTRACT

A method for modifying the hydrophobicity of the surface of a carbon-doped oxide film is disclosed. Carbon-doped oxide films have exhibited a high hydrophobic nature which inhibits effective cleaning of its surface by conventional techniques. The present invention uses a surface treatment comprising a solution of sulfuric acid and hydrogen peroxide in water to alter the hydrophobicity of the carbon-doped oxide. After treatment by the sulfuric acid and hydrogen peroxide solution, the surface of the carbon-doped oxide becomes hydrophilic. Moreover, the modification of the carbon-doped oxide only occurs at the surface. Therefore, the low k dielectric characteristics of the carbon-doped oxide are retained.

8 Claims, 3 Drawing Sheets

content truncated to preserve length …

ENHANCED SURFACE MODIFICATION OF LOW K CARBON-DOPED OXIDE

BACKGROUND OF THE INVENTION

1. Field of the Invention

The present invention relates to the manufacture of low k dielectrics, and more particularly, to a method for treating the surface of the low k dielectric to render it hydrophilic.

2. Background Information

As integrated circuit technology advances, integrated circuit devices become smaller and smaller. This allows for greater speed and increased device packing densities. Sizes of individual features (for example the transistor gate length) on modem integrated circuits is shrinking to less than 0.20 microns. The resultant increase in packing densities and the associated increase in functionality has greatly increased the number and density of metal interconnects on each chip.

The metal interconnects (which consist of conducting lines and vias) have become smaller, more complex, and more closely spaced. The smaller sizes of the metal interconnects leads to RC (resistance-capacitance) coupling problems which include propagation delays and cross talk noise between interlevel and intralevel conductors. RC delays thus limit improvement in device performance. In recent years, the use and development of low resistivity metals such as copper has helped to reduce the resistivity of the interconnect lines. Additionally, capacitance can be reduced by employing low dielectric constant (low k) dielectric materials to insulate between the metal interconnect lines. Since capacitance is directly proportional to the dielectric constant of the insulating material, the RC delay can be reduced when a low k material is used.

Various semiconductor equipment manufacturers have developed low k dielectrics. One of the most promising low k dielectrics are carbon-doped oxides ($SiO_xC_yH_z$) Manufacturers such as Novellus Systems, ASM-Japan, and Applied Materials, Trikon Technologies, and Mattson Technology each manufacture semiconductor equipment (for example, chemical vapor deposition equipment) that can deposit carbon-doped oxides (or CDO). The Novellus Systems carbon-doped oxide film is marketed under the trademark CORAL™, the ASM-Japan carbon-doped oxide film is marketed under the trademark AURORA™, and the Applied Materials carbon-doped oxide film is marketed under the trademark BLACK DIAMOND™. The Mattson Technology CDO film is marketed under the trademark GREEN DOT™ and the Trikon Technologies CDO film is marketed under the trademark LOW K FLOWFILL™.

Carbon-doped oxide possesses an intrinsically low surface energy. As a result, cleaning of the surface of the carbon-doped oxide is extremely difficult due to the hydrophobic nature of the film surface. Cleaning of the carbon-doped oxide surface is important because the surface becomes exposed during normal processing and formation of the interconnect structures. Specifically, during a dual-damascene process or a subtractive metal process, the surface of the carbon-doped oxide is directly exposed. This results in defects or particles on the surface of the carbon-doped oxide that should be removed.

Current techniques for cleaning are primarily directed towards making the surface of the carbon doped oxide hydrophilic. This involves the modification of the top layer of the carbon doped oxide by film deposition recipe change: either by depositing a hydrophilic top layer or by termination of the carbon doped oxide by an oxidative approach. These approaches can degrade the aggregate film dielectric constant or may not necessarily be compatible with copper dual damascene processes. Therefore, what is needed is a method to make the surface of carbon-doped oxide hydrophilic to facilitate cleaning by conventional methods.

SUMMARY OF THE INVENTION

A method for forming a hydrophilic surface on a carbon-doped oxide film is disclosed. The method comprises applying an oxidative chemical solution to said carbon-doped oxide film surface.

BRIEF DESCRIPTION OF DRAWINGS

The foregoing aspects and many of the intended advantages of this invention will become more readily appreciated as the same becomes better understood by reference to the following detailed description, when taken in conjunction with the accompanying drawings, wherein.

DETAILED DESCRIPTION OF THE INVENTION

The present invention describes a method for cleaning the top surface of a carbon-doped oxide film. In a preferred embodiment, the carbon-doped oxide is utilized for damascene applications, and more particularly, copper dual damascene applications. The invention modifies the surface of the carbon-doped oxide film so that defect/particulate removal can be easily achieved. This is accomplished by transforming the surface of the carbon-doped oxide from hydrophobic to hydrophilic.

Figure 1:
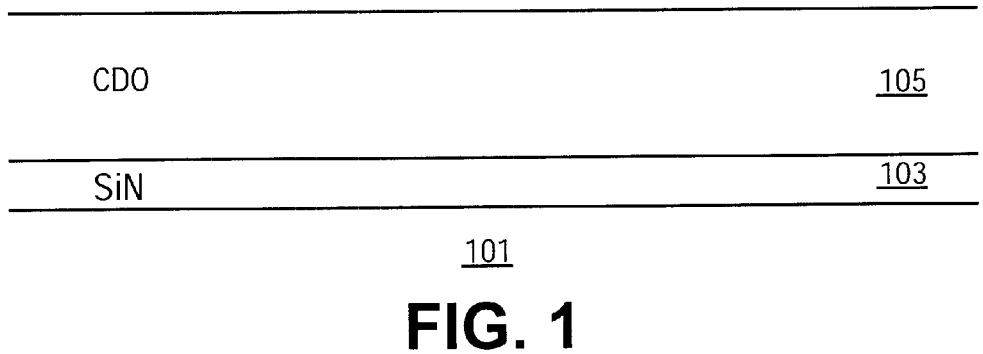
FIGS. 1–3 are schematic cross-sections of a semiconductor substrate illustrating the deposition and surface treatment of a carbon-doped oxide film in accordance with the present invention.

Turning to FIG. 1, in a typical application, a carbon-doped oxide layer 105 is deposited above a silicon nitride layer 103. The silicon nitride layer 103 is formed atop of a substrate 101. The term substrate 101 as used herein may include a semiconductor wafer, active and passive devices formed within the wafer, and layers formed on the wafer surface. Thus, the term substrate is meant to include devices formed within a wafer and layers that overlie the wafer.

In the typical application, the silicon nitride layer 103 acts as an etching stop layer and is deposited over conducting structures formed in the substrate 101. As noted above, the carbon-doped oxide layer 105 is especially useful for it's low k dielectric properties. Thus, it is useful in an intermetal or interlayer dielectric application.

The carbon-doped oxide layer 105 may be formed by any one of the prior art methods. For example, Novellus provides detailed recipes for formation of their CORAL™ CDO film, ASM provides detailed recipes for the formation of their AURORA™ CDO film, and Applied Materials provides detailed recipes for the formation of their BLACK DIAMOND™ CDO film to any purchasers of their manufacturing equipment.

Figure 2:
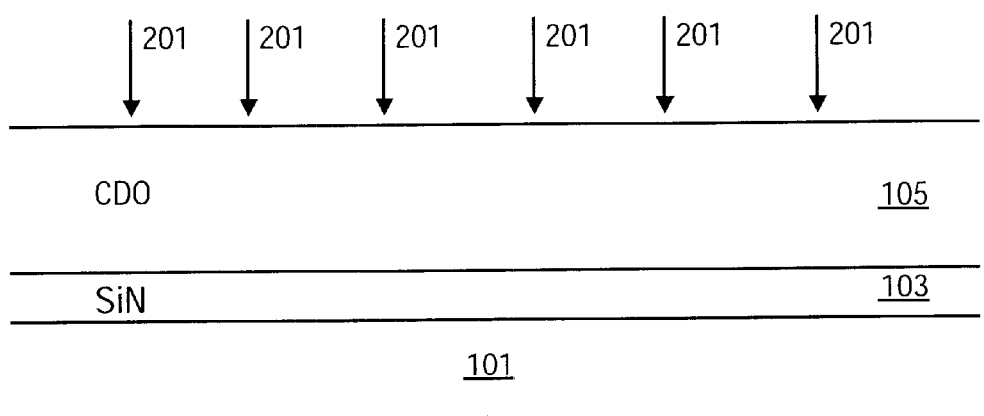

Turning to FIG. 2, in the preferred embodiment, the surface of the carbon-doped oxide layer 105 is subjected to a treatment 201 that comprises exposing the surface of the carbon-doped oxide layer 105 with a solution of sulfuric acid ($H_2SO_4$), hydrogen peroxide ($H_2O_2$), and water ($H_2O$) at 100° C. It was experimentally determined that the volume ratio of sulfuric acid to hydrogen peroxide to water is preferably about 255:68:178. Other ratios would be similarly effective. Preferably, the solution would be a dilute solution of hydrogen peroxide in a weakly acidic solution of 2–10%. Thus, low amounts of hydrogen peroxide in a slightly acidic slurry (such as that used in a chemical mechanical polishing process) can also achieve this effect.

Depending upon the carbon-doped oxide layer 105 and its composition, the time of the treatment 201 may vary between 10 minutes and 30 minutes. In particular, it was determined experimentally that the BLACK DIAMOND™ CDO film became completely hydrophilic after 10 minutes of treatment 201 with hydrophilic tendencies after 6 minutes. The AURORA™ CDO film became completely hydrophilic after 20 minutes of treatment 201 with hydrophilic tendencies after 14 minutes. Finally, the CORAL™ CDO film became completely hydrophilic after 30 minutes of treatment 201 with hydrophilic tendencies after 20 minutes.

The variation in treatment time is surmised to arise from the different types of chemical bonding for the various carbon-doped oxide films. It can be appreciated by those of ordinary skill in the art that for different carbon-doped oxide films, the length of treatment 201 may be experimentally ascertained. Furthermore, although the treatment 201 of the preferred embodiment uses sulfuric acid and hydrogen peroxide, any chemical solution that is strongly oxidative to carbon-doped oxide films would be suitable. For example, hydrogen peroxide in a slightly acidic (e.g. pH between 4–6) solution of either sulfuric acid, nitric acid, or citric acid are suitable.

Figure 3:
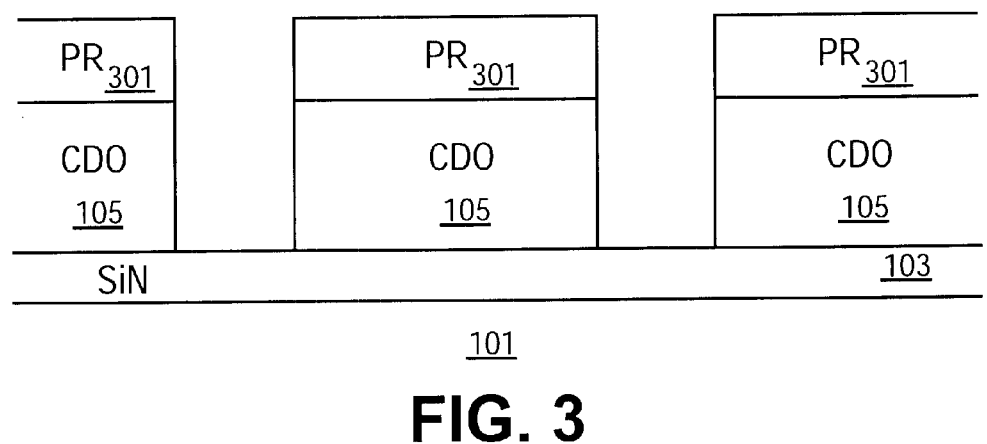

Next, turning to FIG. 3, after the treatment by the sulfuric acid/hydrogen peroxide solution, a photoresist layer 301 is patterned onto the carbon-doped oxide layer 105. The photoresist layer 301 is developed in accordance with the desired via pattern. The carbon-doped oxide layer 105 is then etched using the silicon nitride layer 103 as an etching stop. Conventional steps are then used to form the vias in the carbon-doped oxide layer 105. The photoresist layer 301 is stripped off and further cleaning steps are performed. Because the carbon-doped oxide layer 105 has been treated in accordance with the present invention, it exhibits highly hydrophilic tendencies which facilitates the cleaning process.

An analysis was performed as to the atomic percentage of carbon at the surface of the carbon-doped oxide layer 105. In all cases, for all types of carbon-doped oxides tested, the atomic percentage of carbon dropped. It is surmised that this drop of atomic percentage of carbon causes the normally hydrophobic nature of the carbon-doped oxide to become hydrophilic. Importantly, the change in atomic percentage of carbon only occurs at the surface of the carbon-doped oxide layer. This is important because it maintains the low k value for the bulk of the carbon-doped oxide layer 105.

It can be appreciated that the technique shown in FIGS. 1–3 is preferably performed after deposition of the carbon-doped oxide layer 105. However, in certain applications, such as the formation of copper interconnects using dual damascene technology, the surface treatment may be implemented immediately after chemical mechanical polishing of the copper layer. Specifically, turning to FIGS. 4–6, a method is provided for improving the formation of a copper interconnect using dual damascene technology.

Figure 4:
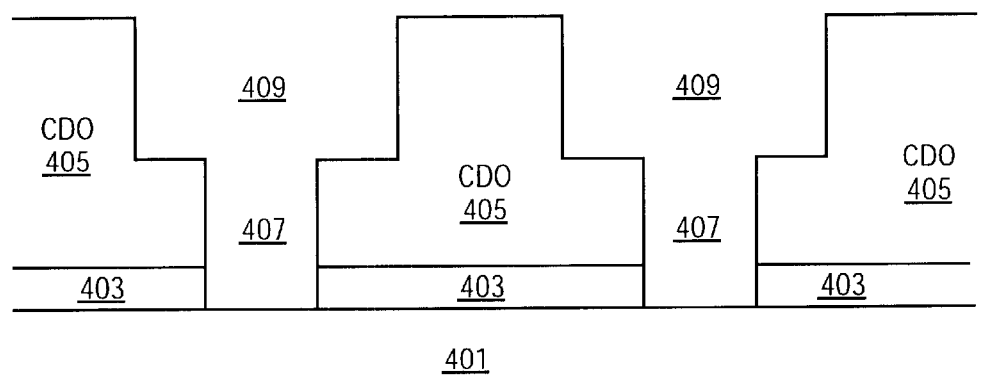
FIGS. 4–6 are schematic cross-sections of a semiconductor substrate illustrating the application of the present invention to a copper dual damascene process.

Referring to FIG. 4, a silicon nitride layer 403 is formed on a substrate 401. Formed atop of the silicon nitride layer 403 is a carbon-doped oxide layer 405. Through various conventional etching steps, via holes 407 are formed through the carbon-doped oxide layer 405 and the silicon nitride layer 403 to reach underlying conductive structures in the substrate 401. Also formed within the carbon-doped oxide layer 405 and above the via holes 407 are the metal interconnect openings 409. The foregoing steps for forming a dual damascene structure is conventional in the prior art.

Figure 5:
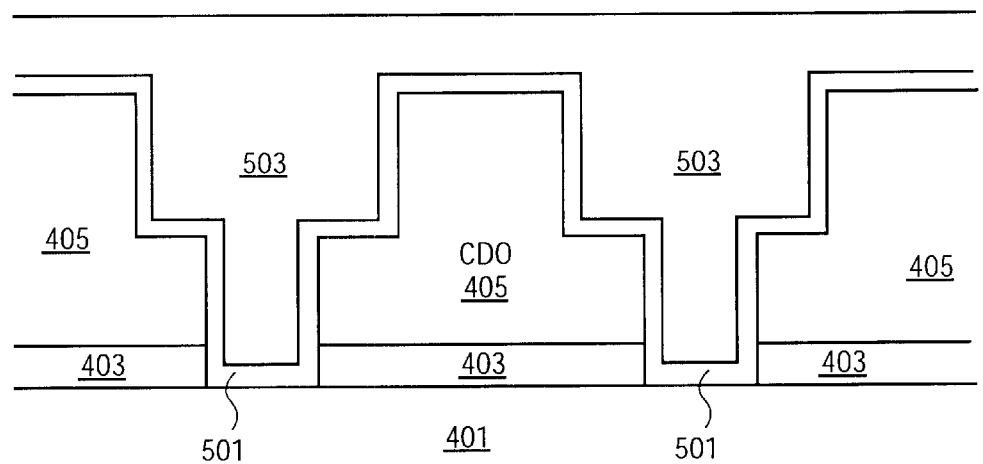

Next, turning to FIG. 5, as is also conventional in the prior art, a copper barrier layer 501 is deposited over the carbon-doped oxide layer 405 and into the via holes 407 and metal interconnect openings 409. Typically, the copper barrier layer 501 is formed from Ta, TaN, TiN, or WN. After the copper barrier layer 501 has been deposited, a bulk copper layer is formed using known techniques into the via holes 407, metal interconnect openings 409 and atop the carbon-doped oxide layer 405.

Figure 6:
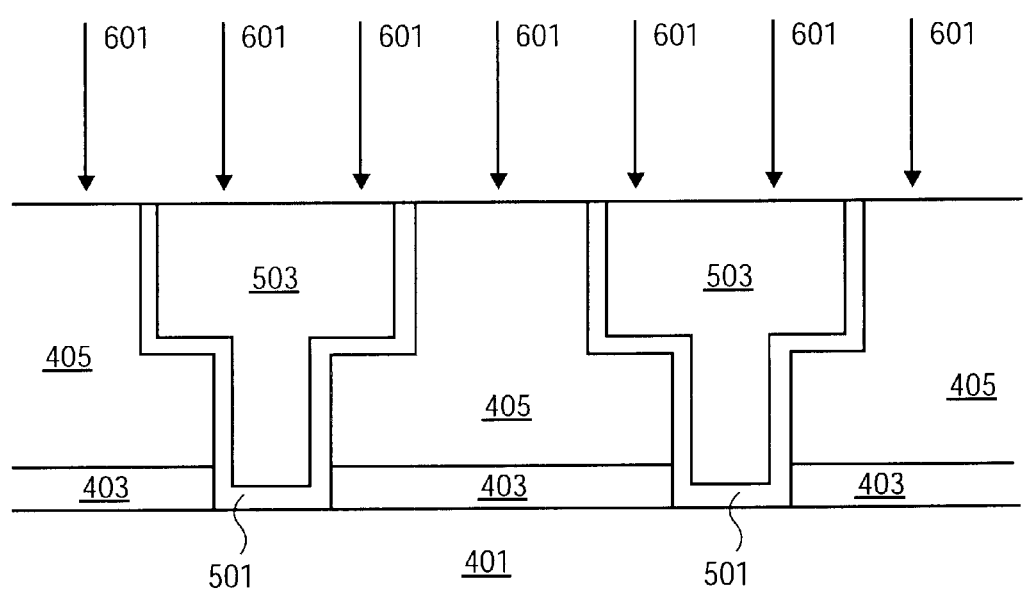

Next, turning to FIG. 6, the copper layer 503 and the copper barrier layer 501 are removed from the surface of the carbon-doped oxide 405 by chemical mechanical polishing (CMP). The polishing is conducted until the copper barrier layer 501 is removed from the top surface of the carbon-doped oxide layer 405. Typically, the CMP process stops upon endpoint detection of the carbon-doped oxide layer 405. Once endpoint detection has been achieved, the surface of the carbon-doped oxide 405 is treated with the sulfuric acid/hydrogen peroxide solution detailed above.

The treatment 601 can be integrated into the CMP process and apparatus. For example, upon endpoint detection during the CMP process, the CMP apparatus may be programmed to introduce the sulfuric acid/hydrogen peroxide solution onto the surface of the wafer or may be incorporated into the CMP slurry. The treatment 601 may require contact with the surface of the carbon-doped oxide layer 405 for up to 30 minutes, depending upon the specific characteristics of the carbon-doped oxide layer 405. Alternatively, the treatment 601 may be implemented as a wet bath, wherein the wafer is removed from the CMP apparatus and dipped into the solution of sulfuric acid and hydrogen peroxide. Following this treatment 601, the surface of the carbon-doped oxide layer 405 exhibits hydrophilic properties. Additionally, it has been found that the treatment 601 will have minimal or no impact on the quality and composition of the copper metal interconnect.

While the preferred embodiment of the invention has been illustrated and described, it will be appreciated that various changes can be made therein without departing from the spirit and scope of the invention.

What is claimed is:

1. A method for forming a metal interconnect on a substrate comprising
   depositing a carbon-doped oxide layer over said substrate;
   forming a dual damascene opening in said carbon doped oxide layer;
   depositing a conducting layer into said dual damascene opening and over said carbon-doped oxide layer;
   removing the portion of said conducting layer that lies over said carbon-doped oxide layer; and
   applying an oxidative chemical solution to said carbon-doped oxide layer surface.

2. The method of claim 1 wherein said depositing of a conducting layer comprises depositing a copper layer.

3. The method of claim 1 wherein said removing of said portion of said conducting layer comprises performing a chemical mechanical polishing (CMP) process.

4. The method of claim 1 wherein said oxidative chemical solution comprises sulfuric acid and hydrogen peroxide.

5. The method of claim 4 wherein said oxidative chemical solution further comprises water.

6. The method of claim 5 wherein said oxidative chemical solution comprises sulfuric acid, hydrogen peroxide, and water in approximately the following ratio: 255:68:178.

7. The method of claim 6 wherein said applying said chemical oxidative solution comprises applying said chemical oxidative solution for between 10 and 30 minutes.

8. The method of claim 7 wherein said applying said chemical oxidative solution comprises applying said chemical oxidative solution to the surface of said carbon-doped oxide film at a temperature of about 100° C.

* * * * *

UNITED STATES PATENT AND TRADEMARK OFFICE
CERTIFICATE OF CORRECTION

PATENT NO. : 6,417,098 B1
DATED : July 9, 2002
INVENTOR(S) : Wong et al.

It is certified that error appears in the above-identified patent and that said Letters Patent is hereby corrected as shown below:

Column 1,
Line 15, delete "modem", insert -- modern --.

Signed and Sealed this

Twenty-eighth Day of January, 2003

JAMES E. ROGAN
*Director of the United States Patent and Trademark Office*